US011250262B2

United States Patent
Raucher (10) Patent No.: US 11,250,262 B2
(45) Date of Patent: Feb. 15, 2022

(54) WILDFIRE SURVEILLANCE UAV AND FIRE SURVEILLANCE SYSTEM

(71) Applicant: RapidDeploy, Inc., Austin, TX (US)

(72) Inventor: Steven Raucher, Austin, TX (US)

(73) Assignee: RapidDeploy, Inc., Austin, TX (US)

(*) Notice: Subject to any disclaimer, the term of this patent is extended or adjusted under 35 U.S.C. 154(b) by 0 days.

(21) Appl. No.: 17/199,010

(22) Filed: Mar. 11, 2021

(65) Prior Publication Data
US 2021/0286999 A1    Sep. 16, 2021

Related U.S. Application Data

(60) Provisional application No. 62/988,703, filed on Mar. 12, 2020.

(51) Int. Cl.
*G06K 9/00* (2006.01)
*G01R 23/165* (2006.01)
*B64C 39/02* (2006.01)

(52) U.S. Cl.
CPC ........ *G06K 9/00657* (2013.01); *B64C 39/024* (2013.01); *G01R 23/165* (2013.01); *B64C 2201/122* (2013.01); *B64C 2201/125* (2013.01); *B64C 2201/127* (2013.01); *G06K 2009/00644* (2013.01)

(58) Field of Classification Search
CPC ...... G06K 9/6288; G06K 9/62; G06K 9/2018; G06K 2009/00644; G06K 9/00657; G06T 7/00; G06T 2207/10048; G06T 2207/10036
See application file for complete search history.

(56) References Cited

U.S. PATENT DOCUMENTS

| | | | | |
|---|---|---|---|---|
| 6,756,592 | B1* | 6/2004 | Smith | G01J 3/457 250/338.5 |
| 8,314,612 | B1* | 11/2012 | Rodgers | G02B 26/02 324/244.1 |
| 8,369,567 | B1* | 2/2013 | Buck | G06K 9/0063 382/100 |
| 9,665,094 | B1* | 5/2017 | Russell | B64D 47/08 |
| 9,977,963 | B1* | 5/2018 | Fendell | G05D 1/0011 |

(Continued)

OTHER PUBLICATIONS

Vodacek et al., Remote optical detection of biomass burning using a potassium emission signature, 2002, int. j. remote sensing, 2002, vol. 23, No. 13, pp. 2721-2726.*

(Continued)

*Primary Examiner* — Guillermo M Rivera-Martinez
(74) *Attorney, Agent, or Firm* — Patent Capital Group (57) ABSTRACT

An unmanned aerial vehicle (UAV) includes a propulsion system, a camera system, a processor, and communications circuitry. The camera system includes an image channel with a band pass filter centered near a spectral line of a material associated with wildfires, and the camera system captures a spectral line emission image within a region of a potential wildfire. The processor uses the captured spectral line emission image to identify an emission event indicative of a wildfire. The communications circuitry transmits, to a dispatch system, data describing a location of an identified emission event. The dispatch system may dispatch firefighting resources to the location of the wildfire.

16 Claims, 2 Drawing Sheets

(56) References Cited

U.S. PATENT DOCUMENTS

| | | | | |
|---|---|---|---|---|
| 2005/0253928 | A1* | 11/2005 | McKeown | G01C 11/02 348/164 |
| 2007/0017281 | A1* | 1/2007 | Rodgers | G02B 27/288 359/484.09 |
| 2008/0036593 | A1* | 2/2008 | Rose-Pehrsson | G08B 25/00 340/540 |
| 2009/0262978 | A1* | 10/2009 | Zavagli | G06K 9/3233 382/103 |
| 2009/0315722 | A1* | 12/2009 | Hou | G08B 17/125 340/578 |
| 2012/0261144 | A1* | 10/2012 | Vian | G05D 1/0088 169/43 |
| 2014/0027131 | A1* | 1/2014 | Kawiecki | G08B 17/005 169/45 |
| 2014/0354996 | A1* | 12/2014 | Fontecchio | G01J 3/51 356/416 |
| 2016/0054733 | A1* | 2/2016 | Hollida | H04N 5/23293 701/2 |
| 2016/0132714 | A1* | 5/2016 | Pennypacker | G06K 9/6255 382/103 |
| 2017/0010215 | A1* | 1/2017 | Guo | G01N 21/71 |
| 2018/0239982 | A1* | 8/2018 | Rutschman | H04N 5/23299 |
| 2018/0239991 | A1* | 8/2018 | Weller | G06F 17/18 |

OTHER PUBLICATIONS

Amici et al., Multi-resolution spectral analysis of wildfire potassium emission signatures using laboratory, airborne and spaceborne remote sensing, 2011, Remote Sensing of Environment 115 (2011) pp. 1811-1823.*

Riccio et al., Remote optical observation of biomass burning: A feasibility and experimental case study with the SIM.GA hyperspectral system, 2011, International Journal of Remote Sensing vol. 32, No. 21, Nov. 10, 2011, pp. 6241-6259.*

Magidimisha et al., Remote optical observations of actively burning biomass fires using potassium line spectral emission, Proc. of SPIE vol. 10036 pp. 1003611-1-6.*

Klett et al. Signal-to-solar clutter calculations of AK-47 muzzle flash at various spectral bandpasses near the potassium D1/D2 doublet, 2010, Proc. SPIE 7697, Signal Processing, Sensor Fusion, and Target Recognition XIX, Proc. of SPIE vol. pp. 7697 76971I-1-8.*

Griffith, et al., "Flight hardware verification and validation of the K-line fire sensor payload on ZACube-2," ResearchGate Conference Paper; Jan. 2019; 10 pages.

Vodacek, et al., "Remote optical detection of biomass burning using a potassium emission signature," ResearchGate Article; Jul. 2002; 8 pages.

* cited by examiner

WILDFIRE SURVEILLANCE UAV AND FIRE SURVEILLANCE SYSTEM

CROSS REFERENCE TO RELATED APPLICATION

This application claims the benefit of and priority to U.S. Provisional Application No. 62/988,703, filed Mar. 12, 2020, the disclosure of which is hereby incorporated by reference herein in its entirety for all purposes.

BACKGROUND

Recent history has highlighted critical gaps in wildfire surveillance capabilities. Some available systems for monitoring and detecting wildfires rely on fixed equipment, such as manned lookout stations or camera systems. Such systems only cover regions in which they are implemented, and manned lookout stations can be difficult to staff, particularly during wildfires. Manned air patrols can fly over at-risk regions, with the pilot or other onboard observers scanning the regions for wildfires. However, resource constraints make it difficult to use air patrols for routine wildfire monitoring, especially as wildfires are occurring across a broader range of locations and the number of wildfire incidents is increasing.

DESCRIPTION OF EXAMPLE EMBODIMENTS OF THE DISCLOSURE

Overview

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

Unmanned aerial vehicles (UAVs) are used in a fire surveillance system that can be quickly deployed to areas at risk of wildfire. In some embodiments, the UAVs have camera systems configured to detect potassium emission events. Potassium occurs naturally in vegetation. Burning vegetation emits the spectral line signature of the potassium atom, so potassium emissions can be used as a signature to distinguish wildfires from other types of fires. Previous wildfire detection techniques include visible light camera systems that use visual data to locate potential fires, or infrared cameras that use thermal imaging to detect hot regions. However, these earlier imaging techniques do not specifically detect wildfires, but also detect structure fires or other fires. Wildfires typically involve a different type of emergency response from other types of fires, and the potassium detection camera is specifically attuned to accurately detecting wildfires.

A fire surveillance system can deploy a UAV with a potassium detection camera to a region at risk of wildfire. For example, an agency that provides fire response may receive a call notifying the agency of a potential wildfire. The caller may provide a location of the potential wildfire, or supplemental data associated with the caller may provide a location of the caller. As another example, a fire agency may determine that a region is at a high risk of wildfire due to dry conditions. The UAV maneuvers along a flight path to capture potassium emission images of the region at risk of wildfire. The captured images are analyzed to determine if a wildfire is present within the region, as described above. In response to detecting a wildfire, the fire surveillance system may determine a response plan based on data describing the wildfire, e.g., the location and current spread of the wildfire, and available resources for fighting the wildfire. The fire surveillance system may output the response plan to a dispatcher, who may dispatch resources to the wildfire according to the response plan. In other embodiments, the fire surveillance system automatically instructs the dispatching of resources to the wildfire, e.g., by transmitting instructions to a fire station.

Unlike fixed surveillance systems, UAVs can be deployed as needed and are not confined to a particular region. For example, UAVs may be staged in an area that is at a heightened risk of wildfires due to recent weather, and UAVs may be deployed throughout that area on an as-needed basis (e.g., in response to a report of a wildfire) or deployed for routine monitoring. Unlike prior manned surveillance systems, such as lookout towers or manned air patrols, UAVs can be quickly and automatically deployed, without relying on a human pilot or lookout. The unmanned nature also allows UAVs to get closer to fires or at-risk areas than manned solutions without endangering human lives. In addition, UAVs may be less expensive to build, maintain, and staff than manned vehicles or viewing stations, allowing agencies to acquire and use a greater number of UAVs and achieve more robust wildfire detection and monitoring.

In one aspect, a UAV includes a propulsion system, a camera system, a processor, and communications circuitry. The propulsion system is configured to maneuver the UAV to a region of a potential wildfire. The camera system is configured to capture a spectral line emission image within the region of the potential wildfire, and the camera system includes a band pass filter centered near a spectral line of a material associated with wildfires. The processor is configured to process the captured spectral line emission image to identify an emission event indicative of a wildfire. The communications circuitry is configured to transmit, to a dispatch system, data describing a location of an identified emission event.

In another aspect, a UAV includes a propulsion system, a camera system, and communications circuitry. The propulsion system is configured to maneuver the UAV to a region of a potential wildfire. The camera system is configured to capture a spectral line emission image within the region of the potential wildfire. The camera system has a band pass filter centered near a spectral line of a material associated with wildfires. The communications circuitry is configured to transmit, to an external processing system, the spectral line emission image, and the external processing system is configured to detect a wildfire in the spectral line emission image.

In still another aspect, a method for detecting wildfires includes dispatching a UAV along a flight path, the UAV including a camera system configured to capture images of emissions characteristic of wildfires; capturing, by the camera system of the UAV, a spectral line emission image at a location along the flight path, the camera system including a band pass filter centered near a spectral line of a material associated with wildfires; processing the captured spectral line emission image to identify an emission event indicative of a wildfire; and transmitting, to a dispatch system, data describing the identified emission event.

As will be appreciated by one skilled in the art, aspects of the present disclosure, in particular aspects of fire surveillance UAVs and fire surveillance systems, described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, circuit designs, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems or be stored upon manufacturing of these devices and systems.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. The terms "substantially," "close," "approximately," "near," and "about," generally refer to being within +/−20%, preferably within +/−10%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms such as "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, showing, by way of illustration, some of the embodiments that may be practiced. In the drawings, same reference numerals refer to the same or analogous elements/materials so that, unless stated otherwise, explanations of an element/material with a given reference numeral provided in context of one of the drawings are applicable to other drawings where elements/materials with the same reference numerals may be illustrated. For convenience, if a collection of drawings designated with different letters are present, e.g., FIGS. 2A-2C, such a collection may be referred to herein without the letters, e.g., as "FIG. 2." The accompanying drawings are not necessarily drawn to scale. Moreover, it will be understood that certain embodiments can include more elements than illustrated in a drawing, certain embodiments can include a subset of the elements illustrated in a drawing, and certain embodiments can incorporate any suitable combination of features from two or more drawings.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

In some examples provided herein, interaction may be described in terms of two, three, four, or more electrical components. However, this has been done for purposes of clarity and example only. It should be appreciated that the devices and systems described herein can be consolidated in any suitable manner. Along similar design alternatives, any of the illustrated components, modules, and elements of the accompanying drawings may be combined in various possible configurations, all of which are clearly within the broad scope of the present disclosure. In certain cases, it may be easier to describe one or more of the functionalities of a given set of flows by only referencing a limited number of electrical elements.

The following detailed description presents various descriptions of specific certain embodiments. However, is to be understood that other embodiments may be utilized, and structural or logical changes may be made without departing from the scope of the present disclosure. In general, the innovations described herein can be embodied in a multitude of different ways, for example, as defined and covered by the claims and/or select examples, and the following detailed description is not to be taken in a limiting sense.

Example UAV

Figure 1:
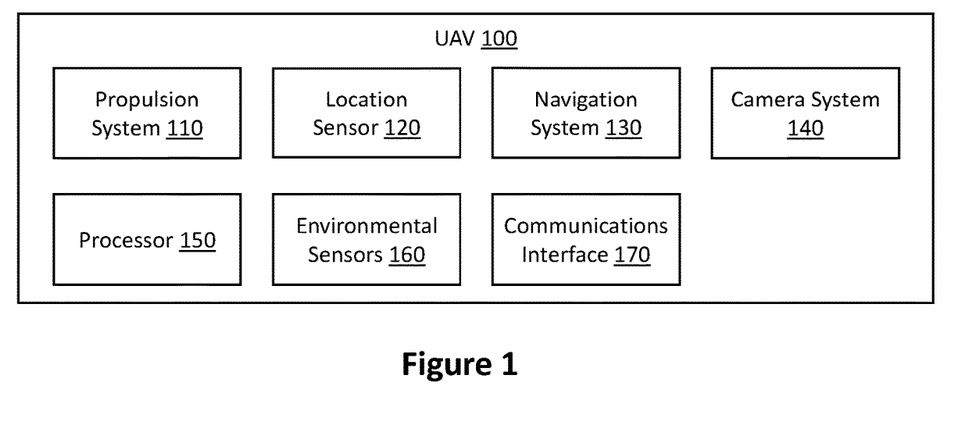
FIG. 1 is a block diagram of a UAV for wildfire detection according to some embodiments of the present disclosure.

FIG. 1 shows a block diagram of a UAV 100 according to some embodiments of the present disclosure. The UAV 100 includes a propulsion system 110, a location sensor 120, a navigation system 130, a camera system 140, a processor 150, environmental sensors 160, and a communications interface 170. In alternative configurations, different and/or additional components may be included in the UAV 100. Additionally, functionality described in conjunction with one or more of the components shown in FIG. 1 may be distributed among the components in a different manner than described in conjunction with FIG. 1 in some embodiments.

The propulsion system 110 maneuvers the UAV 100 along a flight path. The propulsion system 110 may include a power supply (e.g., a battery or engine), propellers and/or wings, navigation software, and other components for physically maneuvering the UAV 100.

The location sensor 120 determines a current location of the UAV 100. The location may be used by the navigation system 130 to assist in navigation, and by the processor 150 to identify the location of a detected wildfire, as described below. In some embodiments, the location sensor 120 determines a latitude and longitude. In some embodiments, the location sensor 120 further determines an altitude. The location sensor 120 may include a GPS receiver and processor for determining location from GPS signals. The location sensor 120 may include other types of sensors that can be used for determining location in combination with or instead of a GPS receiver, such as accelerometers, altimeters, cell signal receivers, etc.

The navigation system 130 instructs the propulsion system 110 to maneuver the UAV 100 along a flight path to a region of a potential wildfire, e.g., a region with a high wildfire risk, or a region where a wildfire was reported. The navigation system 130 include hardware and software for translating a flight path into instructions for the propulsion system 110. The propulsion system 110 receives a current location from the location sensor 120 and determines the flight path according to the current location of the UAV 100.

The navigation system 130 receives instructions to navigate to a region at risk of wildfire. For example, a dispatch system provides a specific latitude and longitude to the navigation system 130, and the navigation system 130 determines a flight path from the UAV's current location to the specified latitude and longitude. In other embodiments, the dispatch system provides a set of locations, e.g., a set of multiple latitude/longitude combinations for the UAV 100 to navigate to, or a specific point and a radius around that point for the UAV 100 to observe. The navigation system 130 may continually or periodically update the flight path according to the current location. In some embodiments, the UAV 100 is controlled by a remote pilot; in such embodiments, the UAV may or may not include the navigation system 130.

The camera system 140 captures images of an environment around the UAV 100. The camera system 140 may include one or more cameras to capture images in different directions around the UAV 100. The camera system 140 may include one or more different types of cameras or camera subsystems for capturing light at particular wavelengths or set of wavelengths, or other particular types of images. For example, the camera system 140 may include one or more cameras for capturing light in the visible spectrum, e.g., light having a wavelength between around 400 nanometers and 750 nanometers, and one or more infrared cameras capturing infrared radiation, e.g., radiation having a wavelength between around 1000 nanometers and around 14000 nanometers, or a subset of this range.

In some embodiments, the camera system 140 includes one or more cameras that capture a particular spectral line or set of spectral lines that can be used to identify wildfires. For example, the camera system 140 includes a camera for capturing potassium emission images. As noted above, burning vegetation has a higher potassium concentration than other types of files, so the spectral line signature of the potassium atom can be used to distinguish wildfires from other types of fires. Potassium has several spectral lines in the near-infrared range, near 769.9 nm and 766.5 nm, that are particularly useful for identifying wildfires. In one embodiment, a camera for capturing potassium emission images captures radiation in a range that includes one or both of these spectral lines.

To identify wildfires using spectral line images, the camera system 140 includes two optical channels: a spectral line detection channel with a narrow band pass filter that selects captured light at one of the spectral lines, and a reference channel with a broader band pass filter that excludes the spectral line emission wavelength. The spectral line detection channel outputs a spectral line emission image, and the reference channel outputs a reference image. The narrow band pass filter of the spectral line detection channel may be centered at a wavelength associated with potassium emission, and have a bandwidth between, for example, 0.1 nm and 5 nm. For example, a potassium detection channel is centered at around 770 nm (e.g., 769.9±0.5 nm), or a potassium detection channel is centered at 766.5 nm (e.g., 766.5 nm±0.5 nm). The reference channel selects a band that does not include the spectral lines; for example, if the band pass filter selects light having a wavelength of 769.9±0.5 nm, the reference channel may select light having a reference channel of 750 nm±10 nm (i.e., 740 to 760 nm). In some embodiments, the spectral line detection channel selects multiple spectral lines, e.g., a band centered around 770 nm and a band centered around 766.5 cm. In some embodiments, the camera may include three or more optical channels to capture multiple spectral bands, e.g., two potassium detection channels and the reference channel. In other embodiments, wavelengths of different potassium spectral lines, or spectral lines of different atoms or molecules associated with wildfires, may be used. In some embodiments, the camera system 140 may capture spectral line images associated with multiple elements or molecules useful for wildfire detection.

The processor 150 receives images captured by the camera system 140 and processes the captured images. In particular, the processor 150 analyzes the captured images to determine if a wildfire is present in the imaged region. For the spectral line emission camera described above, the processor 150 compares the images simultaneously captured by the spectral line detection channel and the reference channel, e.g., pixel by pixel. Pixels that are bright in the spectral line image but not bright in the reference image indicate an emission event at the location of those pixels; the emission event may indicate a wildfire is present at that location. For example, the processor 150 compares the spectral line image to the reference image and identify any portion of the spectral line image having at least a threshold relative brightness to the same portion in the reference image. In other embodiments, the captured images are transmitted to an external processor (e.g., a cloud-based processing system) which analyzes the image to determine if there is a wildfire in the imaged area.

The processor 150, or alternate control circuitry, may communicate with and control other systems of the UAV 100. For example, the processor 150 may receive and process data from the environmental sensors 160, described below. The processor 150 may analyze data from the camera system 140 and/or environmental sensors 160 and generate summary data for sending to a remote system, such as a control center or UAV operator device. If the processor 150 detects an emission event in an image, the processor 150 may retrieve the current location of the UAV 100 from the location sensor 120 (e.g., a GPS device) and associate the detected emission event with the location. The processor 150 may also send control signals to other systems, such as instructions to the camera system 140 to obtain images, or instructions to the environmental sensors 160 to obtain environmental data.

Environmental sensors 160 may be included on the UAV 100 to capture additional data about the environment of the UAV 100. In particular, the environmental sensors 160 may provide additional data that can be used to determine the presence of wildfires, determine current wildfire conditions, predict the spread of wildfires, and/or assist crews in responding to the wildfires. The environmental sensors 160 may include, for example, sensors for detecting temperature, humidity, air pressure, wind direction, and wind speed. In some embodiments, the environmental sensors 160 may include sensors for detecting smoke or particular chemicals in the air that are indicative of fires or wildfires.

The communications interface 170 is configured to send and receive data. For example, the UAV 100 receives navigation instructions from a command center via the communications interface 170, which passes the instructions to the propulsion system 110 and/or processor 150. The communications interface 170 also transmits data from the UAV 100 to other systems. For example, the communications interface 170 may transmit images from the camera system 140 and data from the environmental sensors 160 to the command center or other external system, e.g., when the processor 150 detects an emission event. The communications interface 170 may transmit additional context information with captured data, such as the location of the UAV 100 when data was captured and the time at which the data was captured.

The communications interface 170 may include, for example, a WiFi interface, a Bluetooth interface, a cellular interface, a satellite communications interface, and/or other types of wireless communications interfaces. The communications interface 170 may support multiple types of communication, and select the communication mechanism based on available signals. For example, the communications interface 170 may communicate over a cellular network when WiFi is not available, or communicate via radio signals when a remote operator is within range of the UAV 100.

The communications interface 170 may be offline for periods of time. For example, when the UAV 100 is deployed, the UAV 100 may communicate with a dispatch system or other command center via a cellular network. When the UAV 100 is out of range of cell towers in the network, a memory on the UAV 100 (not shown in FIG. 1) temporarily stores data for transmission to the dispatch system. When the UAV 100 reconnects to the cellular network, the communications interface 170 transmits the stored data to the dispatch system.

The UAV 100 enables early detection of wildfires. For example, the UAV 100, or multiple UAVs 100, can be deployed in an area at an elevated risk of wildfires, e.g., due to hot and dry conditions. The UAV 100 distinguishes wildfires from other types of fires by using line spectroscopy to identify a chemical signature of wildfires, such as potassium. Using line spectroscopy to find a chemical signature specific to wildfires or smoldering vegetation reduces false alarms from other types of fires. Using line spectroscopy as opposed to other methods, such as visual inspection, also improves the ability of the UAV 100 to work in conditions of limited visibility, including at nighttime.

Example Fire Response System

The UAV 100 described above can be utilized in a fire response system. In some embodiments, a fire response system is one aspect of an emergency response or emergency dispatch system. For example, a fire response system may include a cloud-based emergency dispatch system used by dispatchers within a public safety answering point (PSAP). In other embodiments, a dedicated fire response system is used by a fire agency, e.g., a state-wide fire response agency or a parks system. In other embodiments, the fire response system may include an on-premise dispatch system configured for fire response and installed at a dispatch center, such as a PSAP, an emergency communications center (ECC), or a fire agency.

Figure 2:
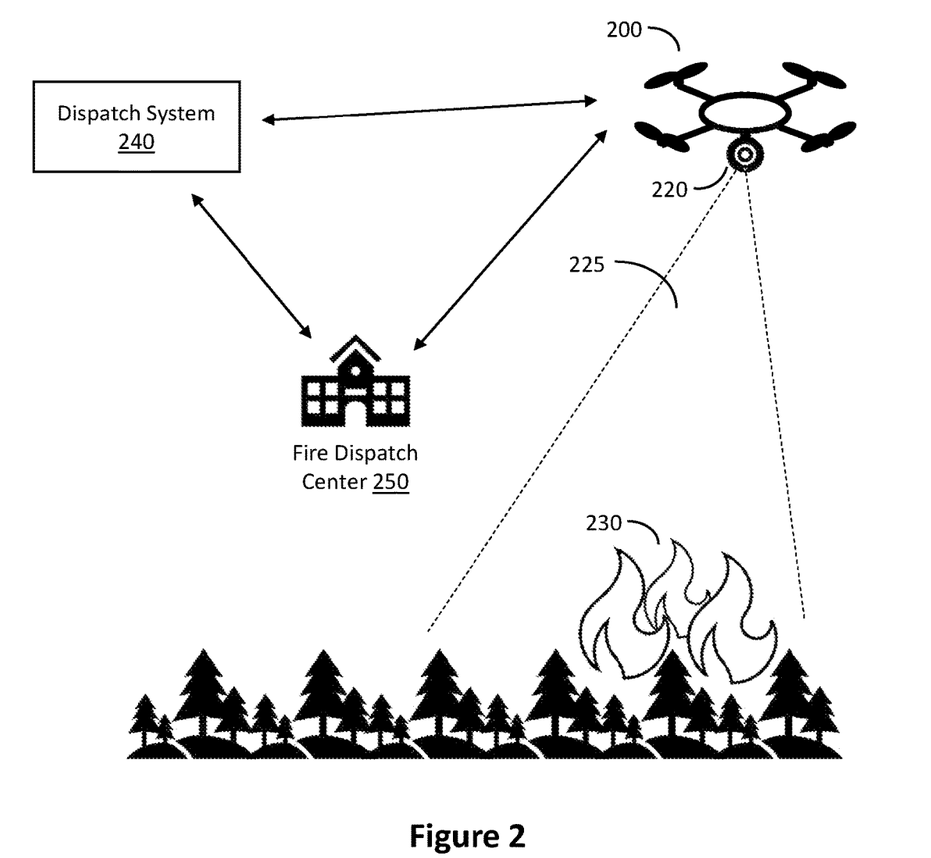
FIG. 2 shows a system diagram illustrating a fire response system and a wildfire detected by the fire response system according to some embodiments of the present disclosure.

FIG. 2 shows a system diagram illustrating a fire response system and a wildfire detected by the fire response system. The system includes a UAV 200, a dispatch system 240, and a fire dispatch center 250. Only one UAV 200 and one fire dispatch center 250 are shown for simplicity; it should be understood that in a working system environment, there may be more of each of these elements.

The UAV 200 is an example of the UAV 100. The UAV 200 has a camera 220, which is an example of or component of the camera system 140. While the UAV 200 shown in FIG. 2 has one camera 220, it should be understood that the camera system of the UAV 200 may include multiple cameras, including different types of cameras. Different cameras may be located at different positions on the UAV 200. The UAV 200 also includes processing circuitry for controlling the cameras and/or processing the images. While only one UAV 200 is shown in FIG. 2, the fire response system may include a fleet of multiple UAVs 200.

The camera 220 has a field of view 225. In this example the field of view 225 is focused on a forest that has an active wildfire 230. The camera 220 may have a fixed field of view relative to the UAV 200, or the camera 220 may have a controllable field of view. For example, the camera 220 may be able to turn in different directions, or may be able to zoom in or out. If the UAV 200 includes multiple cameras, different cameras may be located in different positions and/or in different orientations, providing multiple different fields of view. The camera 220 obtains images, such as the potassium spectral line emission images described above, that can be used to identify wildfires in the field of view of the camera 220. In this example, the camera 220 obtains an image that includes the wildfire 230 and a portion of the surrounding forest.

The dispatch system 240 is a computer system that assists users in responding to wildfires. The dispatch system 240 aggregates information about wildfires and information about available resources for responding to wildfires. The dispatch system 240 provides the aggregated information to the fire dispatch center 250 to assist users at the fire dispatch center 250 in responding to the wildfire. For example, the dispatch system 240 provides user interfaces that assist a user in dispatching resources to a wildfire. While the dispatch system 240 is shown as being separate from the fire dispatch center 250, in some embodiments, the dispatch system 240, or portions of the dispatch system 240, are located within the fire dispatch center 250. The dispatch system 240 is described further in relation to FIG. 3.

The fire dispatch center 250 receives information from the dispatch system 240 and coordinates a wildfire response. The fire dispatch center 250 may be, for example, a PSAP, an emergency communications center (ECC), a state-wide or regional fire agency, or another center involved in assessing and responding to wildfires. The fire dispatch center 250 may be configured to receive calls from the public, e.g., 9-1-1 calls, or non-emergency calls reporting wildfires or other events. In some embodiments, the fire dispatch center 250 is a mobile dispatch center. In some embodiments, the fire dispatch center 250 supports remote users, or is entirely remote, e.g., individuals assisting in wildfire response may use devices (e.g., computers, tablets, smart phones, etc.) that can connect to the dispatch system 240 from any location.

As note above, the dispatch system 240 may be in communication with multiple fire dispatch centers similar to the fire dispatch center 250. Each fire dispatch center may be a subscriber to the dispatch system 240, which provides software to the fire dispatch centers. The fire dispatch center 250 may include one or more user devices used by dispatchers, telecommunicators, or other users. The devices in the fire dispatch center 250 include the hardware and software needed to display user interfaces, connect to an IP-based network, and detect user input. Each device may run an application that allows interaction with the dispatch system 240. In one embodiment, the application is a browser that allows a user to access a web-based service provided by dispatch system 240. In another embodiment, the application is a dedicated application that enables interactions with the dispatch system 240.

Each fire dispatch center has an associated geographic region and may be responsible for responding to wildfires and, in some embodiments, emergency calls and/or other types of alerts or emergencies, within that geographic region. The boundaries of the geographic region associated with the fire dispatch center may be represented as a geofence or a set of geofences (referred to generally as "geofence" or "geofence data"). Geofence data for each fire dispatch center may be stored in the dispatch system 240, and the dispatch system 240 provides relevant information to each fire dispatch center based on the geofence data.

The UAV 200 is in communication with a dispatch system 240 and a fire dispatch center 250. The UAV 200 uses the communications interface 170 described above to communicate wirelessly, e.g., via radio signals, a cell network, or a combination of networks or other communications protocols. In some embodiments, the UAV 200 is in communication with either the dispatch system 240 or the fire dispatch center 250. In some embodiments, the UAV 200 communicates with the fire dispatch center 250 via the dispatch system 240 (e.g., if the UAV 200 has an internet connection). In some embodiments, the UAV 200 communicates with the dispatch system 240 via the fire dispatch center 250 or one or more intermediary devices (e.g., if the UAV 200 has a radio connection to a device used by a remote pilot, which has a radio connection to the fire dispatch center 250).

In the example shown in FIG. 2, the camera 220 of the UAV 200 obtains an image of the field of view 225. The UAV 200 (e.g., the processor 150) may process the image to detect the wildfire 230, as described with respect to FIG. 1. In response to detecting the wildfire 230, the UAV 200 transmits data describing the detected wildfire 230 to the dispatch system 240. For example, the UAV 200 transmits its current location, a potassium line emission image of the wildfire 230, one or more other captured images of the wildfire 230 (e.g., visible light and/or infrared images), environmental data captured by the environmental sensors 160, and a timestamp. In other examples, the UAV 200 transmits the image and additional data to the dispatch system 240, and the dispatch system 240 analyzes the received image to detect the wildfire 230.

The UAV 200 also transmits data captured by the environmental sensors 160 to the dispatch system 240. The UAV 200 may continue to capture additional images of the wildfire 230 and additional environmental data, and the UAV 200 transmits the additional images and data to the dispatch system 240. The UAV 200 may what determine data to send, and/or the frequency at which to send data, dynamically based on current conditions. For example, if the UAV 200 has low power, or low bandwidth, the UAV 200 may send less data (e.g., send fewer or no images), or send data updates less frequently (e.g., transmit data captured by the environmental sensors 160 every minute, rather than every second). If the UAV 200 has high power and high bandwidth available, the UAV 200 may send more data, and/or send data more frequently. In some embodiments, the UAV 200 may dynamically determine what data to send based on whether or not the UAV 200 detects a wildfire 230, e.g., only sending data and/or images in response to detecting a wildfire, or sending more data or more frequent updates after detecting a wildfire.

In some embodiments, the UAV 200 may determine a location of the wildfire and transmit the location of the wildfire to the dispatch system 240. For example, the processor 150 may determine the location of the wildfire 230 based on the captured image and other data, including the current location of the UAV 200 provided by the location sensor 120, the altitude of the UAV 200, the orientation of the UAV 200 and/or the orientation of the camera 220, and the location of the wildfire 230 within the captured field of view 225. In some embodiments, the UAV 200 transmits the location of the UAV 200 when the image with the wildfire 230 was captured as an approximate location of the wildfire 230. The UAV 200 transmits the location of the wildfire, e.g., as a latitude and longitude, to the dispatch system 240.

In some embodiments, the UAV 200 analyzes the image or other data to determine a size or range of the wildfire 230, or to determine other properties of the wildfire 230, and transmits the properties to the dispatch system 240. For example, the processor 150 can determine one or more boundaries of the wildfire 230 based on the captured images. The processor 150 can identify areas above a threshold brightness in the potassium spectrum image, an infrared image, or another image or combination of images, and draw a boundary around the identified areas having at least the threshold brightness. The processor 150 can estimate the real-world boundaries (e.g., longitude and latitude) or points along the real-world boundaries using the current location of the UAV 200, the altitude of the UAV 200, the orientation of the UAV 200 and/or the orientation of the camera 220, and the location of the boundaries within the captured field of view 225. Some or all of the image processing, including the location determination and boundary detection, may alternatively be performed by the dispatch system 240 or another external system based on images and other data received from the UAV 200.

The dispatch system 240 receives the data transmitted by the UAV 200. The dispatch system 240 generates user interfaces based on the received data and provides the user interfaces to users at the fire dispatch center 250. For example, the dispatch system 240 selects one or more images to provide to a user at the fire dispatch center 250. The dispatch system 240 may also select environmental data captured by the environmental sensors 160 and provide the environmental data in the user interface. The dispatch system 240 may also perform further processing on data received from the UAV 200 and provide the processed data in the user interface. If multiple UAVs 200 are deployed to monitor a particular wildfire, the dispatch system 240 combines data received from the multiple UAVs 200, e.g., providing multiple views of the wildfire from different UAV cameras, generating a combined image of the wildfire, or generating a summary of environmental data from multiple UAVs.

Example Dispatch System

Figure 3:
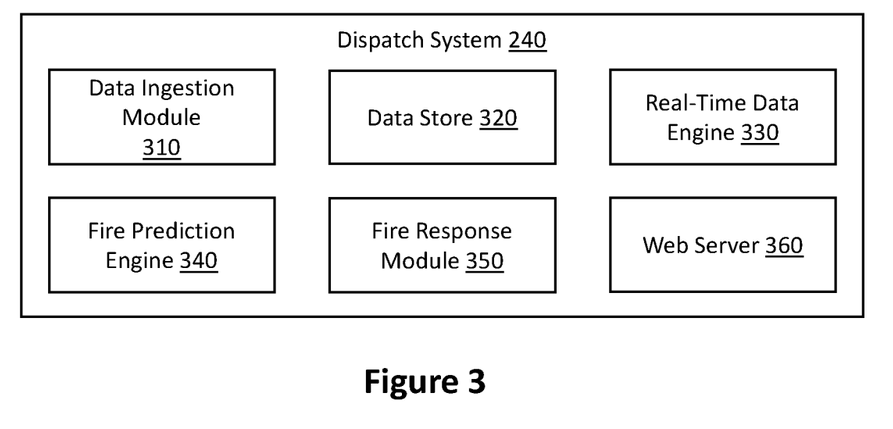
FIG. 3 is a block diagram of the dispatch system according to some embodiments of the present disclosure.

FIG. 3 is a block diagram of the dispatch system 240 according to some embodiments of the present disclosure. The dispatch system 240 includes a data ingestion module 310, a data store 320, a real-time data engine 330, a fire prediction engine 340, a fire response module 350, and a web server 360. In alternative configurations, different and/or additional components may be included in the dispatch system 240. For example, in some embodiments, the dispatch system 240 is a computer-aided dispatch (CAD) system that provides information about emergencies (e.g., emergency calls, which include calls relating to wildfires) and first responders (e.g., fire department resources, as well as medical and/or police responders) to a dispatcher, and enables the dispatcher to connect to first responders and dispatch first responders to specific locations. Additionally, functionality described in conjunction with one or more of the components shown in FIG. 2 may be distributed among the components in a different manner than described in conjunction with FIG. 2 in some embodiments. In some embodiments, the dispatch system 240 is a cloud-based dispatch system that is distributed across one or more remote servers. In other embodiments, the dispatch system 240 is an on-premise dispatch system installed locally at a fire dispatch center 250.

The data ingestion module 310 receives and processes data received from UAVs, e.g., the UAVs 100 and 200 described above. For example, the data ingestion module 310 receives images obtained from the camera system 140 and/or environmental data obtained by the environmental sensors 160. The data ingestion module 310 passes the received images and other data to the data store 320 for storage. The data ingestion module 310 may pass the received images and other data any of the other modules 330-350 for processing.

In some embodiments, the data ingestion module 310 receives and processes call data related to emergency calls, including calls reporting wildfires. For example, if the fire dispatch center 250 is PSAPs, call data received at the PSAP may be transmitted to the dispatch system 240, e.g., via an emergency data gateway (EDG) device. The use of an EDG device to transfer call data from a PSAP to a cloud-based emergency system is described in U.S. Pat. No. 10,264,122, incorporated by reference in its entirety. Call data may include device information, caller information, location information, or other information relating to the emergency call or caller.

The data ingestion module 310 may receive and process data from other sources. For example, supplemental call data sources may provide various types of information relating to an emergency call, such as location information; contact information, such as a phone number; other data that can be used to correlate the supplemental data to an emergency call, such as phone number, name, time stamp, location, etc.; language information (e.g., a device language of the mobile device placing the emergency call); health information; real-time video; images; etc. The data ingestion module 310 may also obtain data specific to wildfire detection and prediction, such as data describing known wildfires in a region, data describing weather conditions and/or wildfire risk in a region, and data describing locations and timing for permitted burns.

The data store 320 provides storage of the data from UAVs, data from calls, supplemental data, and/or other data received by the dispatch system 240. The data store 320 may also store data generated by other modules of the dispatch system 240. For example, the data store 320 may store data entered by users of the dispatch system 240, e.g., data about wildfires entered by users at the fire dispatch center 250. The data store 320 may also store data about various dispatch centers, including geofence data described with respect to FIG. 2.

The data store 320 may be encrypted. In some embodiments, the dispatch system 240 includes a first data store for short-term storage (e.g., for ongoing emergency calls), and a second, longer-term data store accessed to perform periodic analyses. In some embodiments, the dispatch system 240 includes different data stores for different types of data, e.g., a first data store for UAV data, a second data store for call data, a third data store for supplemental data, a fourth data store for geofences, etc. The data store 320 may include one or more of a Binary Large OBject (BLOB) storage service, data warehouse, key-value database, document database, relational database, or any other type of data storage.

The real-time data engine 330 performs real-time processing of wildfire data, including data received from UAVs 100 and 200. The real-time data engine 330 may analyze the incoming data to determine if a wildfire is or may be present in the environment of the UAV. If the real-time data engine 330 detects a wildfire based on UAV data, the real-time data engine 330 may retrieve additional data about the wildfire from additional data sources. For example, the real-time data engine 330 may correlate the detected wildfire to calls received about the wildfire by comparing on the location of the detected wildfire to a caller location. If the wildfire matches a current or previously-received call, the real-time data engine associates the call data and information provided by the caller and stored in the data store 320 with the detected wildfire. The real-time data engine 330 may further aggregate other information related to the wildfire, such as the weather information described above. The real-time data engine 330 may also aggregate data from multiple UAVs detecting the same wildfire or fire system. For example, the real-time data engine 330 may generate a composite image of a wildfire based on images received from multiple UAVs, and/or based on images received from multiple cameras on a single UAV.

The real-time data engine 330 provides data that may be used for dispatching resources to the wildfire to the web server 360. For example, upon detecting a new fire (e.g., a fire not previously known to the dispatch system 240, either from the UAVs or other data sources), the real-time data engine 330 generates a wildfire alert and provides the alert to the web server 360. The dispatch system 240 may compare the location of the wildfire to a permitted burns database and omit a wildfire from alerting if the detected wildfire is a permitted burn, thus mitigating false positive alarms. If the real-time data engine 330 receives additional or updated information about a wildfire, the real-time data engine 330 may update a record related to the wildfire in the data store 320 based on the additional or updated information. The web server 360 may access the data store 320 to provide up-to-date wildfire information in user interfaces provided to fire resource dispatchers.

The fire prediction engine 340 calculates spread predictions based on wildfire data collected by the UAVs 100 and 200 and/or other information. For example, the fire prediction engine 340 accesses the current location and boundaries of the wildfire as determined from the captured images as described with respect to FIG. 2, and additional data captured by other environmental sensors 160 of the UAV 100. In some embodiments, the fire prediction engine 340 performs fire spread modeling based on the Rothermel fire spread model. The fire prediction engine 340 may access and incorporate additional data, including the topography of the area (slope and aspect), data describing previous wildfire burns in the area, data describing fuel particle properties for the area (e.g., heat content, mineral content, particle density), and fuel array arrangements (e.g., fuel load, surface-area-to-volume ratio (SAV), the average depth of fuel bed, and dead fuel moisture of extinction).

Successful fire suppression strategies, reliable community warnings, and effective evacuation planning all hinge on the precision and timeliness of wildfire information and predictions, and generating fire predictions based on real-time data from UAVs 100 or 200 can improve wildfire response. The fire prediction engine 340 may automatically perform the fire spread modeling in response to data identifying a new wildfire, e.g., data received from a UAV 100 identifying the wildfire 230. Further, the fire prediction engine 340 may automatically update the fire spread modeling in response to additional data from UAVs and/or other sources.

In some embodiments, a fire response module 350 receives data describing a wildfire and determines a response plan based on the data. For example, the fire response module 350 receives data describing a detected wildfire from the real-time data engine 330 and/or data ingestion module 310. The fire response module 350 may also receive a fire spread prediction generated by the fire prediction engine 340. Based on the received information, the fire response module 350 determines a response to the wildfire. The response plan may include numbers and types of apparatuses dispatched, number of responders, recommended actions by responders (e.g., ground and/or aerial firefighting, creating fire lines), location of the response, etc. The fire response module 350 may output the response plan to the web server 360, which provides the response plan to a dispatcher so that a dispatcher may review the response plan and dispatch resources accordingly. The fire response module 350 may include various rules for determining the response plan. The fire response module 350 may also receive data describing available resources, including locations and drive times to the wildfire, to automatically determine resources to assign to the wildfire. For example, the fire response module 350 may compare the received wildfire data (e.g., the size of the fire, the speed at which the fire is spreading, etc.) to various thresholds to determine a response plan, e.g., the number of apparatuses to assign to the wildfire.

The web server 360 provides user interfaces for assisting in wildfire response and receives input entered via the user interfaces. The web server 360 may provide a mapping interface, a call-taking interface, and a dispatch interface to devices at fire dispatch centers. The web server 360 provides relevant information to different fire dispatch centers. In particular, the dispatch system 240 may provide emergency response software to multiple fire dispatch centers 250 (e.g., if the dispatch system is a cloud-based dispatch system used by multiple fire dispatch centers), and when the real-time data engine 330 generates a wildfire alert, the web server 360 can identify appropriate agency or division (e.g., the ECC assigned to the location of the fire) based on the location of the wildfire and the coverage area of the agencies, e.g., as indicated by the geofence data described above. For example, the web server 360 compares the location of the fire, or the boundaries of the fire, to operational coverage polygons associated with ECCs, and the web server 360 routes the alert to the appropriate ECC for processing and response. The web server 360 or another component of the dispatch system 240 may compare the location of the wildfire to a permitted burns database, and omit a wildfire from alerting if the detected wildfire is a permitted burn, thus mitigating false positive alarms.

In some embodiments, in addition to providing an alert to the fire dispatch center controlling the area in which the wildfire was detected, the web server 360 automatically provides alerts to all high-risk operational areas detected within a spread simulation path generated by the fire prediction engine 340. In some embodiments, the web server 360, or a separate alerting server, may provide notifications to other parties, such as public alerting systems. For example, an alerting server may retrieve data from population census databases and plot evacuation routes for the public. The alerting server may integrate with the IPAWS (Integrated Public Alert and Warning System), WEA (Wireless Emergency Alerts) system, or other public alerting systems to provide mass public notifications of wildfire notifications, evacuation routes, or other information.

Method for Detecting and Responding to Wildfires

Figure 4:
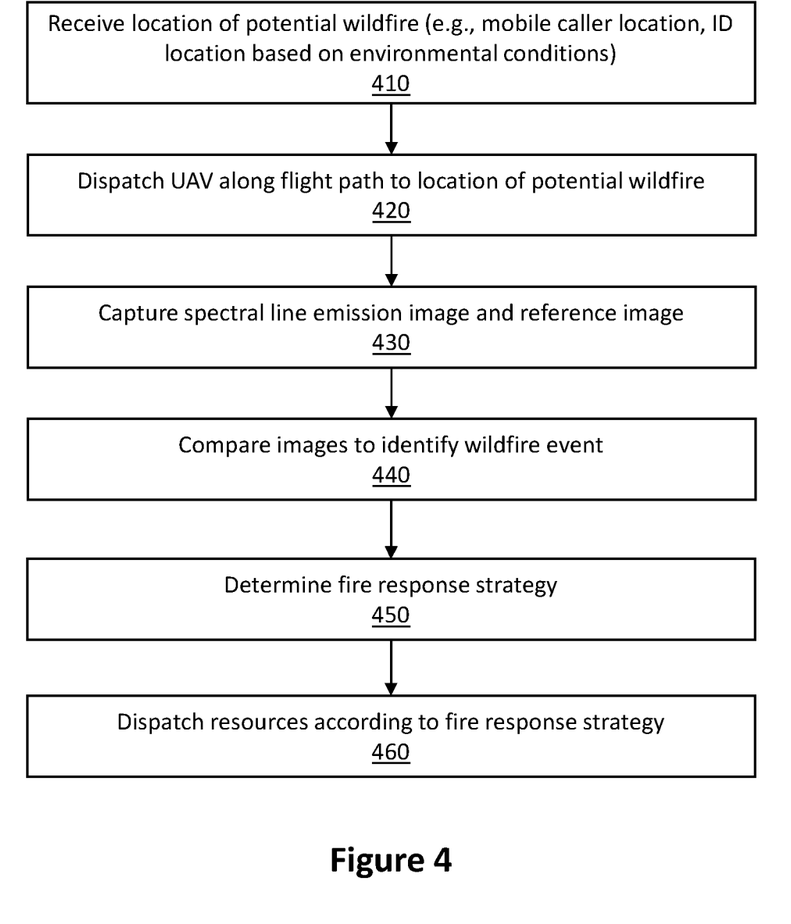
FIG. 4 shows an example method for detecting and responding to a wildfire according to some embodiments of the present disclosure.

FIG. 4 shows an example method for detecting and responding to a wildfire. A fire surveillance system (e.g., the dispatch system 240) receives 410 a location of a potential wildfire. For example, the location may be a cell phone location of a mobile caller reporting a wildfire. As discussed above, the PSAP may receive call data including a caller location, and the PSAP (e.g., an EDG device located at the PSAP) transmits the caller location to the data ingestion module 310. Alternatively, the data ingestion module 310 may receive the cell phone location from a supplemental data provider, e.g., a mobile phone provider that accesses the cell phone's location and transmits it to the dispatch system 240. As still another example, a dispatcher at the fire dispatch center 250 receives location information from the caller and enters the location into a user interface, which transmits the location to the dispatch system 240. In some embodiments, rather than using a caller location, the dispatch system 240 receives data describing a region having a high risk of wildfires based on environmental conditions. In one example, the location may be a region that is routinely surveilled by UAVs, e.g., a remote location that is scheduled for daily or weekly monitoring during wildfire season.

The fire surveillance system (e.g., the dispatch system 240 or the fire dispatch center 250) dispatches 420 a UAV along a flight path that includes the location of the potential wildfire. The fire surveillance system may automatically dispatch the UAV, e.g., in response to a report of a wildfire, in response to detecting an elevated wildfire risk, or according to a flight schedule. In other examples, an operator at the fire dispatch center 250 instructs dispatching of the UAV. The dispatch system 240 or another system may automatically determine the flight path for the UAV based on the location or region for surveillance.

The UAV captures 430 a spectral line emission image and a reference image. As discussed above, the UAV may capture a potassium emission image and a reference image. The UAV (e.g., the processor 150), or a fire surveillance system (e.g., the dispatch system 240) receiving the images, compares 440 the spectral line emission image and the reference image to identify a wildfire event.

In response to identifying a wildfire event, the fire surveillance system determines 450 a fire response strategy. For example, the fire response module 350 determines a strategy that includes dispatching at least one emergency vehicle to the location of the wildfire event. In addition to the identified location of the wildfire, the fire response module 350 may determine the fire response strategy based on real-time data describing available resources for responding to a wildfire, data describing weather conditions in the area of the wildfire (e.g., from environmental sensors 160 or other sources), a predicted fire spread (e.g., provided by the fire prediction engine 340), and other data. The fire surveillance system (e.g., the dispatch system 240) and/or a dispatcher dispatches 460 resources according to the fire response strategy. For example, the web server 360 of the dispatch system 240 provides the fire response strategy via a user interface to a dispatcher or fire response coordinator, who may accept or modify the fire response strategy.

OTHER IMPLEMENTATION NOTES, VARIATIONS, AND APPLICATIONS

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

It should be appreciated that the electrical circuits of the accompanying drawings and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of any of the devices and systems described herein may also be implemented with respect to the methods or processes described herein and specifics in the examples may be used anywhere in one or more embodiments.

What is claimed is:

1. An unmanned aerial vehicle (UAV) comprising:
a propulsion system configured to maneuver the UAV to a region of a potential wildfire;
a camera system configured to capture images within the region of the potential wildfire, the camera system comprising:
a first camera channel comprising a first band pass filter centered near a spectral line of a material associated with wildfires; and
a second camera channel comprising a second band pass filter excluding the spectral line of the material associated with wildfires;
a processor configured to:
receive a first image from the first camera channel and a second image from the second camera channel, the first image and the second image corresponding to a same area; and
compare the first image to the second image to identify an emission event based on a location in the first image having at least a threshold relative brightness to a corresponding location in the second image; and
communications circuitry configured to transmit, to a dispatch system, data describing the identified emission event.

2. The UAV of claim 1, wherein the first band pass filter is centered at around 770 nm and has a bandwidth of between 0.1 nm and 5 nm.

3. The UAV of claim 1, wherein the first band pass filter is centered at around 766.5 nm and has a bandwidth between 0.1 nm and 5 nm.

4. The UAV of claim 1, further comprising an environmental sensor configured to measure at least one of temperature, humidity, air pressure, wind direction, and wind speed.

5. The UAV of claim 1, further comprising a second camera system configured to capture images of light in the visible spectrum, wherein the communication circuitry is further configured to transmit images captured by the second camera system in response to the processor identifying the emission event.

6. The UAV of claim 1, further comprising at least one location sensor for determining the location of the UAV, wherein the data describing the identified emission event comprises a location of a wildfire, the location of the wildfire based on the location of the UAV when the emission event is identified.

7. The UAV of claim 1, the processor further configured to determine a location of at least one boundary of the emission event, the data describing the identified emission event comprising the location of the at least one boundary.

8. An unmanned aerial vehicle (UAV) comprising:
a propulsion system configured to maneuver the UAV to a region of a potential wildfire;
a camera system configured to capture images within the region of the potential wildfire, the camera system comprising:
a first camera channel to output a first image, the first camera channel comprising a first band pass filter centered near a spectral line of a material associated with wildfires; and
a second camera channel to output a second image, the second camera channel comprising a second band pass filter excluding the spectral line of the material associated with wildfires, the second image corresponding to a same area as the first image; and communications circuitry configured to transmit, to an external processing system, the first image and the second image, the external processing system configured to:
- receive the first image and the second image from the UAV; and
- compare the first image to the second image to identify an emission event based on a location in the first image having at least a threshold relative brightness to a corresponding location in the second image.

9. The UAV of claim 8, wherein the first band pass filter is centered at around 770 nm or 766.5 nm, and the first band pass filter has a bandwidth of between 0.1 nm and 5 nm.

10. The UAV of claim 8, further comprising an environmental sensor configured to measure at least one of temperature, humidity, air pressure, wind direction, and wind speed.

11. The UAV of claim 8, further comprising a second camera system configured to capture images of light in the visible spectrum, wherein the communication circuitry is further configured to transmit images captured by the second camera system.

12. The UAV of claim 8, further comprising at least one location sensor for determining the location of the UAV, the communications circuitry configured to transmit the location of the UAV associated with the first image and the second image.

13. A method for detecting wildfires comprising:
- dispatching an unmanned aerial vehicle (UAV) along a flight path, the UAV comprising a camera system configured to capture images of emissions characteristic of wildfires;
- capturing, by the camera system of the UAV, a spectral line emission image at a location along the flight path, a first camera channel for capturing the spectral line emission image comprising a first band pass filter centered near a spectral line of a material associated with wildfires;
- capturing, by the camera system of the UAV, a reference image at the location along the flight path, a second camera channel for capturing the reference image comprising a second band pass filter excluding the spectral line of the material associated with wildfires, the spectral line emission image and the reference image corresponding to a same area;
- processing the spectral line emission image and reference image to identify an emission event indicative of a wildfire, the processing comprising comparing the spectral line emission image to the reference image to identify the emission event based on a location in the spectral line emission image having at least a threshold relative brightness to a corresponding location in the reference image; and
- transmitting, to a dispatch system, data describing the identified emission event.

14. The method of claim 13, wherein the first band pass filter is centered at around 770 nm or 766.5 nm, and the first band pass filter has a bandwidth of between 0.1 nm and 5 nm.

15. The method of claim 13, further comprising obtaining, from an environmental sensor, an environmental measurement comprising at least one of temperature, humidity, air pressure, wind direction, and wind speed, and transmitting the environmental measurement to the dispatch system.

16. The method of claim 13, further comprising obtaining an image of visible light from a second camera system of the UAV, and transmitting the image of visible light to the dispatch system.

* * * * *